United States Patent [19]
Ferrier

[11] Patent Number: 5,869,130
[45] Date of Patent: Feb. 9, 1999

[54] PROCESS FOR IMPROVING THE ADHESION OF POLYMERIC MATERIALS TO METAL SURFACES

[75] Inventor: Donald Ferrier, Thomaston, Conn.

[73] Assignee: Mac Dermid, Incorporated, Waterbury, Conn.

[21] Appl. No.: 873,992

[22] Filed: Jun. 12, 1997

[51] Int. Cl.⁶ .......................................................... B05D 5/12
[52] U.S. Cl. ........................... 427/98; 106/14.05; 216/13; 252/79.2; 252/79.4; 427/123; 427/327
[58] Field of Search ........................... 106/14.05; 216/13; 252/79.2, 79.4; 427/98, 123, 327

[56] References Cited

U.S. PATENT DOCUMENTS

| | | |
|---|---|---|
| 4,409,037 | 10/1983 | Landau . |
| 4,642,161 | 2/1987 | Akahoshi et al. . |
| 4,775,444 | 10/1988 | Cordani . |
| 4,844,981 | 7/1989 | Landau . |
| 4,902,551 | 2/1990 | Nakaso et al. . |
| 4,981,560 | 1/1991 | Kajihara et al. . |
| 4,997,516 | 3/1991 | Adler . |
| 4,997,722 | 3/1991 | Adler . |
| 5,289,630 | 3/1994 | Furrier et al. . |
| 5,300,323 | 4/1994 | Ahmed ................................. 427/435 X |
| 5,800,859 | 9/1998 | Price et al. ................................. 427/98 |

FOREIGN PATENT DOCUMENTS

WO9619097  6/1996  WIPO .

OTHER PUBLICATIONS

A.G. Osborne—An Alternate Route to Red Oxide for Inner Layers P.C. Fabrication Magazine (Aug., 1984).

*Primary Examiner*—Michael Lusignan
*Attorney, Agent, or Firm*—John L. Cordani

[57] ABSTRACT

A process is described for treating metal surfaces with a composition comprising an oxidizer, an acid, a corrosion inhibitor, a source of holide ions and optionally a water soluble polymer in order to increase the adhesion of polymeric materials to the metal surface.

20 Claims, No Drawings

PROCESS FOR IMPROVING THE ADHESION OF POLYMERIC MATERIALS TO METAL SURFACES

BACKGROUND OF THE INVENTION

The present invention relates to printed circuits, and more particularly to a process for fabricating a multilayer printed circuit.

Printed circuits containing one or more circuitry innerlayers are in prominent use today as demand increases for further and further weight and space conservation in electronic devices.

In the typical fabrication of a multilayer printed circuit, patterned circuitry innerlayers are first prepared by a process in which a copper foil-clad dielectric substrate material is patterned with resist in the positive image of the desired circuitry pattern, followed by etching away of the exposed copper. Upon removal of the resist, there remains the desired copper circuitry pattern.

One or more circuitry innerlayers of any particular type or types of circuitry pattern, as well as circuitry innerlayers which might constitute ground planes and power planes, are assembled into a multilayer circuit by interposing one or more partially-cured dielectric substrate material layers (so-called "per-preg" layers) between the circuitry innerlayers to form a composite of alternating circuitry innerlayers and dielectric substrate material. The composite is then subjected to heat and pressure to cure the partially-cured substrate material and achieve bonding of circuitry innerlayers thereto. The so-cured composite will then have a number of through-holes drilled therethrough, which are then metallized to provide a means for conductively interconnecting all circuitry layers. In the course of the through-hole metallizing process, desired circuitry patterns also typically will be formed on the outer-facing layers of the multilayer composite.

An alternate approach to the formation of a multilayer printed circuit board is through additive or surface laminer circuitry techniques. These techniques begin with a non-conductive substrate, upon which the circuit elements are additively plated. Further layers are achieved by repeatedly applying an imageable coating upon the circuitry and plating further circuit elements upon the imageable coating.

It has long been known that the strength of the adhesive bond formed between the copper metal of the circuitry innerlayers and the cured pre-preg layers, or other non-conductive coatings, in contact therewith leaves something to be desired, with the result that the cured multilayer composite or the coating is susceptible to delamination in subsequent processing and/or use. In response to this problem, the art developed the technique of forming on the copper surfaces of the circuitry innerlayers (before assembling them with pre-preg layers into a multilayer composite) a layer of copper oxide, such as by chemical oxidation of the copper surfaces. The earliest efforts in this regard (so-called "black oxide" adhesion promoters) produced somewhat minimal improvement in the bonding of the circuitry innerlayers to the dielectric substrate layers in the final multilayer circuit, as compared to that obtained without copper oxide provision. Subsequent variations on the black oxide technique included methods wherein there is first produced a black oxide coating on the copper surface, followed by post-treatment of the black oxide deposit with 15% sulfuric acid to produce a "red oxide" to serve as the adhesion promoter, such as disclosed by A. G. Osborne, "An Alternate Route To Red Oxide For Inner Layers", PC Fab. August, 1984, as well as variations involving direct formation of red oxide adhesion promoter, with varying degrees of success being obtained. The most notable improvement in this art is represented in the U.S. Pat. Nos. 4,409,037 and 4,844,981 to Landau, the teachings both of which are included herein by reference in their entirety, involving oxides formed from relatively high chlorite/relatively low caustic copper oxidizing compositions, and producing substantially improved results in circuitry innerlayer adhesion.

As earlier noted, the assembled and cured multilayer circuit composite is provided with through-holes which then require metallization in order to serve as a means for conductive interconnection of the circuitry layers of the circuit. The metallizing of the through-holes involves steps of resin desmearing of the hole surfaces, catalytic activation, electroless copper depositing, electrolytic copper depositing, and the like. Many of these process steps involve the use of media, such as acids, which are capable of dissolving the copper oxide adhesion promoter coating on the circuitry innerlayer portions exposed at or near the through hole. This localized dissolution of the copper oxide, which is evidenced by formation around the through-hole of a pink ring or halo (owing to the pink color of the underlying copper metal thereby exposed), can in turn lead to localized delamination in the multilayer circuit.

The art is well aware of this "pink ring" phenomenon, and has expended extensive effort in seeking to arrive at a multilayer printed circuit fabrication process which is not susceptible to such localized delamination. One suggested approach has been to provide the adhesion promoting copper oxide as a thick coating so as to retard its dissolution in subsequent processing simply by virtue of sheer volume of copper oxide present. This turns out to be essentially counter-productive, however, because the thicker oxide coating is inherently less effective as an adhesion promoter per se. Other suggestions relating to optimization of the pressing/curing conditions for assembling the multilayer composite have met with only limited success.

Other approaches to this problem involve post-treatment of the copper oxide adhesion promoter coating prior to assembly of circuitry innerlayers and pre-preg layers into a multilayer composite. For example, U.S. Pat. No. 4,775,444 to Cordani discloses a process in which the copper surfaces of the circuitry innerlayers are first provided with a copper oxide coating and then contacted with an aqueous chromic acid solution before the circuitry innerlayers are incorporated into the multilayer assembly. The treatment serves to stabilize and/or protect the copper oxide coating from dissolution in the acidic media encountered in subsequent processing steps (e.g. through-hole metallization), thereby minimizing pink ring/delamination possibilities.

U.S. Pat. No. 4,642,161 to Akahoshi et al, U.S. Pat. No. 4,902,551 to Nakaso et al, and U.S. Pat. No. 4,981,560 to Kajihara et al, and a number of references cited therein, relate to processes in which the copper surfaces of the circuitry innerlayers, prior to incorporation of the circuitry innerlayers into a multilayer circuit assembly, are first treated to provide a surface coating of adhesion-promoting copper oxide. The copper oxide so formed is then reduced to metallic copper using particular reducing agents and conditions. As a consequence, the multilayer assembly employing such circuitry innerlayers will not evidence pink ring formation since there is no copper oxide present for localized dissolution, and localized exposure of underlying copper, in subsequent through-hole processing. As with other techniques, however, processes of this type are suspect in terms of the adhesion attainable between the dielectric substrate layers and the metallic copper circuitry innerlayers. This is particularly so in these reduction processes since the circuitry bonding surface not only is metallic copper, but also presents the metallic copper in distinct phases (i.e., (1) copper-from-reduction-of-copper oxide over (2) copper of the copper foil) which are prone to separation/delamination along the phase boundary.

U.S. Pat. Nos. 4,997,722 and 4,997,516 to Adler similarly involve formation of a copper oxide coating on the copper surfaces of circuitry innerlayers, followed by treatment with a specialized reducing solution to reduce the copper oxide to metallic copper. Certain portions of the copper oxide apparently may not be reduced all the way to metallic copper (being reduced instead to hydrous cuprous oxide or cuprous hydroxide), and those species are thereafter dissolved away in a non-oxidizing acid which does not attack or dissolve the portions already reduced to metallic copper. As such, the multi-layer assembly employing such circuitry innerlayers will not evidence pink ring formation since there is no copper oxide present for localized dissolution, and localized exposure of underlying copper, in subsequent through-hole processing. Here again, however, problems can arise in terms of the adhesion between the dielectric layers and metallic copper circuitry innerlayers, firstly because the bonding surface is metallic copper, and secondly because the metallic copper predominately is present in distinct phases (i.e., (1) copper-from-reduction-of-copper oxide over (2) copper of the copper foil), a situation prone to separation/delamination along the phase boundary.

U.S. Pat. No. 5,289,630 to Ferrier et al., the teachings of which are incorporated herein by reference in their entirety, reveals a process whereby an adhesion promoting layer of copper oxide is formed on the circuit elements followed by a controlled dissolution and removal of a substantial amount of the copper oxide in a manner which does not adversely affect the topography.

PCT Application No. WO 96/19097 to McGrath, the teachings of which are incorporated by reference herein in their entirety, discusses a process for improving the adhesion of polymeric materials to a metal surface. The process discussed involves contacting the metal surface with an adhesion-promoting composition comprising hydrogen peroxide, an inorganic acid, a corrosion-inhibitor and a quaternary ammonium surfactant.

This invention proposes a process for improving the adhesion of polymeric materials to a metal surface, especially copper or copper alloy surfaces. The process proposed herein is particularly useful in the production of multilayer printed circuits. The process proposed herein provides optimum adhesion between the metallic and polymeric surfaces (ie. the circuitry and the intermediate insulating layer), eliminates or minimizes pink ring and operates economically, all as compared to conventional processes.

SUMMARY OF THE INVENTION

The inventors herein propose a process for improving the adhesion of polymeric materials to metal surfaces, particularly copper and copper alloy surfaces. The proposed process comprises:
1) Contacting the metal surface with an adhesion-promoting composition comprising:
   a) an oxidizer;
   b) an acid;
   c) a corrosion inhibitor; and
   d) a source of halide ions;
2) thereafter bonding the polymeric material to the metal surface.

The inventors have found that the foregoing process improves the adhesion of metal surfaces to the polymeric materials, particularly when the metal surfaces comprise copper or copper alloys. The process proposed is particularly suited to the production of multilayer printed circuit boards.

DETAILED DESCRIPTION OF THE INVENTION

The inventor herein has found that the adhesion between a metal surface and a polymeric material is enhanced by contacting the metal surface with an adhesion-promoting composition prior to bonding the polymeric material to the metal surface. The invention therefore proposes a process for increasing the adhesion of a polymeric material to a metal surface, said process comprising:
1) contacting the metal surface with an adhesion-promoting composition comprising:
   a) an oxidizer;
   b) an acid;
   c) a corrosion inhibitor;
   d) a source of halide ions; and
   e) optionally, a water soluble polymer;
2) thereafter bonding the polymeric material to the metal surface.

The inventors have found that the proposed adhesion-promoting composition produces a micro-roughened conversion-coated surface upon the metal. The surface produced is particularly suited to bonding with polymeric materials in that significantly increased adhesion values are achieved as compared to a non-treated metal surface. In addition the conversion coated (treated) metal surface maintains the increased adhesion over time and decreases the likelihood of any unwanted reactions occurring over time between the metal and the polymeric material.

The process proposed is particularly suited to the manufacture of multilayer printed circuit boards. Thus, in this application, the metal circuitry (usually copper) of the innerlayers is treated with the adhesion-promoting composition proposed herein. After treatment, followed by water rinsing, the innerlayers are bonded together with polymeric materials such as pre-pregs or imageable dielectrics, resulting in the multilayer printed circuit board.

The metal surface to be treated may comprise a variety of metals such as copper, copper alloys, nickel and iron. However, the process of the invention produces the best results when the metal surfaces comprise copper or copper alloys. The polymeric material may be a variety of polymeric materials including pre-preg materials, imageable dielectrics, photoimageable resins, soldermasks, adhesives or polymeric etch resists.

The oxidizer used in the adhesion-promoting composition may comprise any oxidizer which is capable of oxidizing the metal surface in the matrix of the adhesion-promoting composition. The inventors have found hydrogen peroxide and persulfates to be particularly preferred oxidizers for use in the process of the invention, with hydrogen peroxide being the most preferred oxidizer. The concentration of the oxidizer in the adhesion-promoting composition may range from 6 to 60 grams per liter but is preferably from 12 to 30 grams per liter.

The acid utilized in the adhesion-promoting composition may be any acid which is stable in the matrix, however, the inventors have found mineral acids to be particularly preferred. Sulfuric acid is especially preferred. The concentration of the acid in the adhesion-promoting composition may range from 5 to 360 grams per liter but is preferably from 70 to 110 grams per liter.

The corrosion inhibitor used in the adhesion-promoting composition is a compound which effectively reacts with the metal surface to form a protective complex layer. Preferred corrosion inhibitors are selected from the group consisting of triazoles, benzotriazoles, tetrazoles, imidazoles, benzimidazoles and mixtures of the foregoing. The concentration of the corrosion inhibitor in the adhesion-promoting composition may range from 1 to 20 grams per liter but is preferably from 6 to 12 grams per liter.

The source of halide ions may be any compound which would provide halide ions in the matrix of the adhesion-promoting composition. Preferably, the source of halide ions are alkaline earth salts such as sodium chloride or potassium chloride, oxohalides such as sodium chlorate or potassium chlorate, or halide bearing mineral acids such as hydrochloric acid. Most preferably the source of halide ions provides chloride ions to the adhesion-promoting composition. The concentration of the source of halide ions in the adhesion-promoting composition may range from 5 to 500 milligrams per liter but is preferably from 10 to 50 milligrams per liter, all based on halide ion content.

Optionally, but preferably, the adhesion-promoting composition also comprises a water soluble polymer. Preferably the water soluble polymer is not a wetter or surfactant but is instead a water soluble homopolymer or copolymer of low molecular weight water soluble monomers. Most preferably, the water soluble polymer is a polymer of ethylene oxide, an ethylene oxide-propylene oxide copolymer, polyethylene glycols, polypropylene glycols or polyvinyl alcohols. Among the most preferred are the polymers of ethylene oxide, or polyethylene glycols sold by the Union Carbide company under the tradename Carbowax. The inventors have found Carbowax 750 and Carbowax MPEG 2000 to be particularly useful. Also particularly useful are the ethylene oxide polymers or ethylene oxide-propylene oxide copolymers sold by the BASF company under the Pluronic tradename. The concentration of the water soluble polymer in the adhesion-promoting composition can range from 1 to 15 grams per liter, but is preferably from 3 to 6 grams per liter. The inventor has found that the proper combination of halide and water soluble polymer provide the best possible results in creating improved bonding and reliability between metal surfaces and polymeric bonding materials.

The metal surface can be treated with the adhesion-promoting composition in a variety of ways, including immersion, spray, or flood. The temperature of the adhesion-promoting composition during treatment may range from 80° F. to 150° F. but is preferably from 90° F. to 120° F. The treatment time will vary depending upon the temperature and method of treatment but may range from 15 seconds to 15 minutes and is preferably from 1 to 2 minutes.

The following examples are illustrative of the invention but should not be taken as limiting:

EXAMPLE I

A copper clad panel and a copper foil were processed through the following cycle:

| | |
|---|---|
| MacDermid Omniclean CI, 165° F. | 5 min. |
| Rinse | 2 min. |
| Adhesion-Promoting Composition, 116° F. | 2 min. |
| Rinse | |

The adhesion-promoting composition was prepared as follows:

| | |
|---|---|
| Sulfuric acid | 5% by volume |
| Hydrogen Peroxide (50%) | 5% by volume |
| Benzotriazole | 5 gr/l |
| Sodium Chloride | 80 mg/l |
| Water | balance |

A slightly nonuniform, thin brown/pink coating was formed on the panel. The coating was very slightly nonadherent to tape and not marred by fingertip.

The panel and foil were dried with forced air, baked at 150° C. for twenty minutes and laminated with NELCO tetrafunctional B stage (pre-preg) material at 325 psi and 380° F. After lamination the foil side was taped and stripped to provide foil strips one inch wide for peel strength determination. The panel was baked for two hours and 110° C. Portions of the panel were immersed in solder at 550° F. for ten and twenty seconds.

The following peel strengths were observed:

| Solder Immersion Time | Peel Strength |
|---|---|
| 0 sec. | 8.0 lb/in |
| 10 sec. | 6.8 lb/in |
| 20 sec. | 5.9 lb/in |

In addition the panel was drilled with 42 mil holes in an area not subjected to solder immersion and processed through a standard desmear and electroless plated through-hole process. The plated panels were sectioned, potted, polished horizontally and inspected for attack around the drilled holes ("pink ring").

Ping ring—0.0 mils.

EXAMPLE 2

To the adhesion-promoting composition of Example 1, was added 5 gr/l of Carbowax 750 (methoxypolyethylene glycol) from the Union Carbide Company. The temperature was lowered to 105° F. and the panel and foil were otherwise processed as noted in Example I. A uniform red/brown coating was formed that was adherent to tape and not marred by pressure of a fingertip. The following results were achieved:

| Solder Immersion Time | Peel Strength |
|---|---|
| 0 Sec | 7.0 lb/in |
| 10 Sec | 7.0 lb/in |
| 20 Sec | 7.0 lb/in |

Pink Ring: 0.0 mils.

EXAMPLE 3

Example 1 was repeated except that the composition of the adhesion-promoting composition was as follows:

| | |
|---|---|
| Sulfuric acid | 5% by volume |
| Hydrogen Peroxide (50%) | 5% by volume |
| Benzotriazole | 5 gr/l |
| Carbowax MPEG 2000 | 3 gr/l |
| Sodium Chloride | 40 mg/l |
| Water | balance |

The temperature was 120° C. The panel and foil were processed otherwise as in Example 1. A uniform brown surface, adherent to tape and not marred by fingertip was created. The results were as follows:

| Solder Immersion Time | Peel Strength |
|---|---|
| 0 Sec | 10.5 lb/in |
| 10 Sec | 9.5 lb/in |
| 20 Sec | 9.0 lb/in |

Pink Ring: 1.5 mils.

EXAMPLE 4

Example 1 was repeated except that the composition of the adhesion-promoting composition was as follows:

| Sulfuric Acid | 5% by volume |
|---|---|
| Hydrogen Peroxide (50%) | 5% by volume |
| Benzotriazole | 5 gr/l |
| Sodium Chloride | 10 mg/l |

The temperature was 92° F. The panel and foil were processed otherwise as in Example 1 for one minute. A nonuniform, very dark pink/purple coating was formed. The coating was slightly nonadherent to tape and slightly marred by fingertip. The following results were observed:

| Solder Immersion Time | Peel Strength |
|---|---|
| 0 Sec | 6.8 lb/in |
| 10 Sec | 6.5 lb/in |
| 20 Sec | 6.2 lb/in |

Pink Ring: 1.5 mils.

EXAMPLE 5

Example 4 was repeated except that 3 gr/l of Carbowax 750 was added to the adhesion-promoting composition. The panel and foil were processed as in Example 4 except that a predip consisting of 3 gr/l Carbowax 750 in water was utilized prior to the adhesion-promoting composition. A slightly non-uniform dark purple/pink coating was formed. The coating was very slightly nonadherent to tape and slightly soft to fingertip marring. The results were as follows:

| Solder Immersion Time | Peel Strength |
|---|---|
| 0 Sec | 5.0 lb/in |
| 10 Sec | 5.8 lb/in |
| 20 Sec | 5.8 lb/in |

Pink Ring: 2.0 mils.

EXAMPLE 6

Example 1 was repeated except that the composition of the adhesion-promoting composition was as follows:

| Sulfuric Acid | 5% by volume |
|---|---|
| Hydrogen Peroxide (50%) | 3% by volume |
| Benzotriazole | 8 gr/l |
| Polyethylene Glycol (molecular wt. 1500) | 3 gr/l |
| Sodium Chloride | 20 mg/l |
| Water | balance |

A panel and foil were processed as in Example 1 except that a predip of 3 gr/l polyethyleneglycol (MW=1500) in water was utilized prior to the adhesion-promoting composition. The panel and foil were treated for 30 seconds at 90° F. A uniform very dark pink coating was formed. The coating was slightly nonadherent to tape and was not marred by fingertip. The following results were achieved:

| Solder Immersion Time | Peel Strength |
|---|---|
| 0 Sec | 7.0 lb/in |
| 10 Sec | 7.0 lb/in |
| 20 Sec | 6.8 lb/in |

Pink Ring: 1.0 mils.

EXAMPLE 7

Example 1 was repeated except that the composition of the adhesion-promoting composition was as follows:

| Sulfuric Acid | 5% by volume |
|---|---|
| Hydrogen Peroxide (50%) | 3% by volume |
| Tolyltriazole | 5 gr/l |
| Carbowax MPEG 2000 | 4 gr/l |
| Sodium Chloride | 40 mg/l |
| Water | balance |

The temperature was 120° F. The panel and foil were processed as otherwise in Example 1. A uniform dark brown surface slightly nonadherent to tape and not marred by fingertip was obtained. The results were as follows:

| Solder Immersion Time | Peel Strength |
|---|---|
| 0 seconds | 6.8 lb/in |
| 10 seconds | 6.8 lb/in |
| 20 seconds | 6.2 lb/in |

Pink Ring: 1.0 mils.

EXAMPLE 8

Example 1 was repeated except that the composition of the adhesion-promoting composition was as follows:

| Sulfuric Acid | 5% by volume |
|---|---|
| Hydrogen Peroxide (50%) | 3% by volume |
| Benzotriazole | 8 gr/l |
| Polyvinylalcohol (avg. MW 14,000) | 6 gr/l |
| Potassium chlorate | 100 mg/l |
| Water | balance |

The temperature was 100° F. The panel and foil were processed as in Example 1, except that a predip of 3 gr/l polyvinylalcohol was used without rinse before the micro-etch. A slightly nonuniform, slightly nonadherent purple/pink surface not marred by fingertip was created. The results were as follows:

| Solder Immersion Time | Peel Strength |
| --- | --- |
| 0 seconds | 6.0 lb/in |
| 10 seconds | 6.0 lb/in |
| 20 seconds | 5.8 lb/in |

Pink Ring: 0.0 mils.

COMPARATIVE EXAMPLE

A panel and foil were processed through MacDermid's Omni Bond Oxide System according to the following cycle:

| | |
| --- | --- |
| MacDermid Omniclean CI, 165° F. | 5 min |
| Rinse | 2 min |
| MacDermid G-4 Microetch, 110° F. | 2 min |
| Rinse | |
| MacDermid Omnibond Predip, 130° F. | 1 min |
| MacDermid Omnibond, 150° F. | 5 min |
| Rinse | 2 min |

A uniform dark black, adherent coating was formed. The panel and foil were laminated and tested as in Example 1. The following results were achieved.

| Solder Immersion Time | Peel Strength |
| --- | --- |
| 0 Sec | 8.0 lb/in |
| 10 Sec | 6.0 lb/in |
| 20 Sec | 6.0 lb/in |

Pink Ring: 12–23 mils.

What is claimed is:

1. A process for increasing the adhesion of a polymeric material to a metal surface, said process comprising:
   a). contacting the metal surface with an adhesion-promoting composition comprising an adhesion-promoting effective amount of:
      1. an oxidizer;
      2. an acid;
      3. a corrosion inhibitor;
      4. a source of halide ions; and
      5. optionally, a water soluble polymer; and thereafter
   b). bonding the polymeric material to the metal surface.

2. A process according to claim 1 wherein the oxidizer is selected from the group consisting of hydrogen peroxide and persulfates.

3. A process according to claim 1 wherein the concentration of the oxidizer is from 6 to 60 grams per liter, the concentration of the acid is from 5 to 360 grams per liter, the concentration of the corrosion inhibitor is from 1 to 20 grams per liter and the concentration of halide ions is from 5 to 500 milligrams per liter.

4. A process according to claim 1 wherein the corrosion inhibitor is selected from the group consisting of triazoles, benzotriazoles, imidazoles, benzimidazoles, tetrazoles and mixtures of the foregoing.

5. A process according to claim 1 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

6. A process according to claim 1 wherein the metal surface comprises copper.

7. A process according to claim 5 wherein the metal surface comprises copper.

8. A process according to claim 6 wherein the oxidizer is selected from the group consisting of hydrogen peroxide and persulfates.

9. A process according to claim 6 wherein the corrosion inhibitor is selected from the group consisting of triazoles, benzotriazoles, imidazoles, tetrazoles, benzimidazoles, and mixtures of the foregoing.

10. A process according to claim 9 wherein the acid is a mineral acid.

11. A process according to claim 10 wherein the water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

12. A process according to claim 10 wherein the source of halide ions is selected from the group consisting of sodium chloride, potassium chloride, oxohalide salts, and halide bearing mineral acids.

13. A process according to claim 10 wherein the source of halide ions is a source of chloride ions.

14. A composition useful in treating metal surfaces prior to bonding polymeric materials to metal surfaces, said composition comprising an adhesion-promoting effective amount of:
   a. an oxidizer;
   b. an acid;
   c. a corrosion inhibitor;
   d. a source of halide ions; and
   e. optionally, a water soluble polymer.

15. A composition according to claim 14 wherein the oxidizer is selected from the group consisting of hydrogen peroxide and persulfates.

16. A composition according to claim 14 wherein the concentration of the oxidizer is from 6 to 60 grams per liter, the concentration of the acid is from 5 to 360 grams per liter, the concentration of the corrosion inhibitor is from 1 to 20 grams per liter and the concentration of halide ions is from 5 to 500 milligrams per liter.

17. A composition according to claim 14 wherein the corrosion inhibitor is selected from the group consisting of triazoles, benzotriazoles, imidazoles, tetrazoles, benzimidazoles, and mixtures of the foregoing.

18. A composition according to claim 14 wherein water soluble polymer is selected from the group consisting of polymers of ethylene oxide, ethylene oxide-propylene oxide copolymers, polyethylene glycols, polypropylene glycols, polyvinyl alcohols, and mixtures of the foregoing.

19. A composition according to claim 14 wherein the source of halide ions is selected from the group consisting of sodium chloride, potassium chloride, oxohalide salts, and halide bearing mineral acids.

20. A composition useful in treating metal surfaces prior to bonding polymeric materials to metal surfaces, said composition comprising:
   a. from 6 to 60 grams per liter of an oxidizer;
   b. from 5 to 360 grams per liter of an acid;
   c. from 1 to 20 grams per liter of a corrosion inhibitor;
   d. from 5 to 500 milligrams per liter of halide ions; and
   e. optionally, a water soluble polymer.

* * * * *